United States Patent [19]
Moran

[11] Patent Number: 5,750,195
[45] Date of Patent: May 12, 1998

[54] DEPOSITION OF DIAMOND ON OXIDIZABLE MATERIAL

[75] Inventor: Mark B. Moran, Ridgecrest, Calif.

[73] Assignee: The United States of America as represented by the Secretary of the Navy, Washington, D.C.

[21] Appl. No.: 856,153

[22] Filed: May 14, 1997

Related U.S. Application Data

[63] Continuation of Ser. No. 702,208, May 16, 1991.

[51] Int. Cl.$^6$ .................................................. C23C 16/26
[52] U.S. Cl. ..................... 427/249; 427/255.7; 427/577; 427/248.1
[58] Field of Search ................................... 427/249, 577, 427/255.7, 575, 248.1; 423/446

[56] References Cited

U.S. PATENT DOCUMENTS 4,707,384  11/1987  Schachner et al. .

FOREIGN PATENT DOCUMENTS 2-267284  11/1990  Japan .

*Primary Examiner*—Roy V. King
*Attorney, Agent, or Firm*—Stephen J. Church; Melvin J. Sliwka

[57] ABSTRACT

In a process for depositing a diamond layer from an activated gaseous mixture including hydrogen and carbon where the process is facilitated by the inclusion of oxygen in the mixture and the diamond is deposited directly on a material, such as a nitride interlayer, which is oxidized by oxygen in the activated mixture, an activated mixture without oxygen is provided at the beginning of the depositing of the diamond layer and an activated mixture containing oxygen is provided when the diamond layer attains a thickness sufficient to protect the material from oxidation by the oxygen in the activated mixture.

5 Claims, No Drawings

DEPOSITION OF DIAMOND ON OXIDIZABLE MATERIAL

CROSS REFERENCE TO RELATED APPLICATION

This application is a continuation of commonly owned U.S. patent application Ser. No. 07/702,208 which was filed 16 May 1991; for which Notice of Allowance was mailed 23 Jan. 1997; and which is incorporated by reference in this application.

BACKGROUND OF THE INVENTION

1. Field of the Invention

The present invention pertains to processes for plural coatings which include diamond and are by activated vapor deposition from a mixture containing oxygen.

2. Description of the Prior Art

Chemical vapor deposition (CVD) of a film or layer of polycrystalline diamond onto a substrate is well-known and is more fully described in the above-referenced U.S. patent application Ser. No. 07/702,208. In CVD, atoms to be deposited on a substrate are provided in molecules of a gas present in a chamber containing gas at a pressure less than atmospheric; and the gas is activated while in contact with the substrate by microwave energy, a hot filament, electric discharge, or combustion so that the gas releases free radicals containing the atoms to be deposited on the substrate.

In deposition of diamond by CVD, a gas containing the carbon for diamond formation is provided as small proportion of a gaseous mixture in the chamber, the balance of the mixture being predominately hydrogen. The carbon containing gas is usually methane and is present in the mixture at a proportion less than 5% and, typically, 0.5% to 2%. However, the necessary carbon-containing free radicals may be obtained from vapors of other hydrocarbons, alcohols, or the like. It is known in diamond CVD to add a small amount of oxygen to the mixture of hydrogen and carbon containing gas, the proportion of oxygen being substantially less than that of methane. The oxygen increases the rate and quality of diamond deposition by oxidizing graphite which, depending on the deposition conditions, may be deposited along with the diamond.

In accordance with the above-referenced U.S. patent application Ser. No. 07/702,208, an adhering, continuous diamond film of optical or semiconductor quality is formed on a substrate by depositing a relatively thin interlayer of a refractory nitride on the substrate and then depositing diamond directly onto the interlayer by chemical vapor deposition from microwave activated gas without mechanically treating or seeding the substrate or the interlayer. However, the presence of oxygen in the activated gas oxidizes the interlayer and may destroy the interlayer before the deposition of the diamond film is initiated.

However, it is believed apparent to one skilled in the art that similar problems with substrate oxidation and substrate surface damage may occur when oxygen is used in other gaseous mixtures for CVD and other purposes and when oxygen is used with other substrate and interlayer materials for any purpose including purposes where mechanically treating or seeding the substrate or the interlayer is acceptable.

BRIEF SUMMARY OF THE INVENTION

In the deposition of a first material from an activated mixture of gases, where the deposition of the first material is facilitated by oxygen in the activated mixture and the first material is deposited directly on a second material oxidized by oxygen in the activated mixture, such an activated mixture which is substantially without oxygen is provided at the beginning of the deposition of the first material and then such an activated mixture which includes oxygen is provided after the first material is deposited to a thickness sufficient to protect the second material from oxidation by oxygen in the activated mixture.

A specific use of the invention is in chemical vapor deposition (CVD) of a diamond film from a microwave activated gaseous mixture including hydrogen and carbon where the diamond deposition is facilitated by the inclusion of oxygen in the mixture to improve the rate and quality of diamond deposition and where the diamond deposition is desired directly on a nitride interlayer which may have a thickness less than about 2500 angstrom units at the beginning of diamond deposition and which is at substrate temperature of as much as about 1100° C. during depositing the diamond. Under these conditions the interlayer may be so damaged by oxidization due to oxygen in the activated mixture that diamond deposition is not initiated. However and in accordance with the present invention, deposition of a diamond film is achieved by not providing the activated mixture with oxygen until the deposited diamond attains a thickness sufficient to protect the interlayer from oxidation by the oxygen in the activated mixture.

It is therefore an object of the present invention to provide chemical vapor deposition on an oxidizable material from an activated mixture of gases containing oxygen.

DETAILED DESCRIPTION OF THE INVENTION

Apparatus, materials, and operating conditions which are an environment for the present invention are not a part of the invention but are now briefly described. Such apparatus, materials, and conditions are well-known, and a representative such environment is more fully described in the above-identified U.S. patent application Ser. No. 07/702, 208. Although the present invention is effective in the production of a layered structure—such as an optical element having a polycrystalline diamond film deposited directly on a refractory nitride interlayer which is deposited on a substrate—it will be apparent that the invention is not limited to an optical element, to an interlayer, or to any specific materials.

A representative vacuum chamber used in the practice of the present invention admits microwave energy at 2.45 GHz for resonance with hydrogen molecules to form a plasma ball of activated gas above a stage mounting a substrate and an interlayer on which diamond is deposited from the activated gas. The substrate may be heated by an induction heating to a selected temperature. The chamber has a ring manifold for distributing feed gas to the chamber interior.

The chamber is associated with a gage for precise measurement of the vacuum within the chamber; an exhaust system for maintaining a selected chamber pressure, typically 0.1 to 100 Torr, by pumping while feed gas is being provided to the chamber; and a gas supply system connected between the ring manifold and bottles which contain the gases hydrogen, methane, and oxygen used in representative CVD of diamond involving the present invention. The gas supply system is adapted to provide the chamber with a selected flow of any gas or of any predetermined mixture of gases from the bottles by valves individually interconnecting each bottle to the ring manifold.

The thermodynamic conditions for CVD deposition of diamond instead of graphite, where the diamond is deposited at a useful rate and with useful purity require that the surface on which such deposition occurs be at 600° to about 1100° C. since lower temperatures result in substantially no deposition and higher temperatures result in the deposition of graphite only. It is apparent that a nitride used to form the interlayer must resist these deposition temperatures, and refractory nitrides such as aluminum nitride and silicon nitride are effective for this purpose. It is, of course, necessary that the refractory nitride be sufficiently thick and regular to allow substantial and regular diamond nucleation. If the nitride interlayer is too thin, it may be so damaged by the highly erosive activated hydrogen of the plasma ball that diamond nucleation does not occur. A nitride interlayer thickness of at least 500 to about 2500 angstrom units has been found satisfactory to resist this activated hydrogen and to allow the interlayer surface to be effectively cleaned by exposure to a plasma ball of substantially pure hydrogen prior to introducing methane to commence diamond deposition.

However, although the interlayer is of this thickness and is constructed of such a refractory nitride, the use of oxygen in the activated gaseous mixture when the methane is initially introduced may result in the above-described problem of such oxidation of the nitride that no diamond film is deposited. This problem is obviated by the present invention where the gaseous mixture is substantially free from oxygen at the beginning of diamond deposition so that the nitride interlayer is not oxidized; and, after a sufficient thickness of diamond layer has been deposited to protect the nitride, introducing oxygen into the mixture to promote faster growth and purity of subsequently deposited diamond.

It is evident that many modifications and variations are possible in light of the above teachings. It is, therefore, to be understood that within the scope of the following claims the invention may be practiced other than as specifically set forth in the above description.

What is claimed is:

1. A method of depositing a layer of a first material from an activated mixture of gases, wherein said depositing of said layer of said first material is facilitated by oxygen in the activated mixture; wherein the layer of the first material is deposited directly on a second material oxidized by oxygen in the activated mixture; and wherein the method comprises providing an activated mixture of gases substantially without oxygen at the beginning of said depositing of said layer of said first material and providing an activated mixture of gases with oxygen after said layer of said first material is deposited to a thickness sufficient to protect said second material from oxidation by oxygen in the activated mixture.

2. The method of claim 1 wherein said first material is diamond and is deposited from an activated mixture including hydrogen and a gas containing carbon.

3. The method of claim 1 wherein said second material is disposed in an interlayer deposited on a substrate material, and wherein said layer of said first material is deposited on said interlayer.

4. The method of claim 3 wherein said first material is diamond deposited from an activated mixture including hydrogen and a gas containing carbon, and wherein said second material is a nitride.

5. The method of claim 4 wherein said interlayer has a thickness less than about 2500 angstrom units at the beginning of said depositing of said layer of said first material, and wherein said substrate material is at a temperature in the range of about 600° C. to about 1100° C. during said depositing of said layer of said first material.

* * * * *